United States Patent
Ohta

(10) Patent No.: US 7,595,829 B2
(45) Date of Patent: Sep. 29, 2009

(54) SOLID-STATE IMAGE PICKUP DEVICE

(75) Inventor: Sougo Ohta, Toyama (JP)

(73) Assignee: Panasonic Corporation, Osaka (JP)

( * ) Notice: Subject to any disclaimer, the term of this patent is extended or adjusted under 35 U.S.C. 154(b) by 443 days.

(21) Appl. No.: 11/494,727

(22) Filed: Jul. 28, 2006

(65) Prior Publication Data

US 2007/0058062 A1 Mar. 15, 2007

(30) Foreign Application Priority Data

Sep. 13, 2005 (JP) .............................. 2005-265387

(51) Int. Cl.
*H04N 5/335* (2006.01)
(52) U.S. Cl. ..................... 348/308; 348/294; 348/302
(58) Field of Classification Search ......... 348/294–324; 257/290–292, 239, 368; 250/208.1–208.6
See application file for complete search history.

(56) References Cited

U.S. PATENT DOCUMENTS

| | | | | |
|---|---|---|---|---|
| 5,631,704 | A * | 5/1997 | Dickinson et al. | 348/308 |
| 5,955,753 | A * | 9/1999 | Takahashi | 257/292 |
| 6,021,172 | A * | 2/2000 | Fossum et al. | 377/60 |
| 6,033,478 | A | 3/2000 | Kholodenko | |
| 6,160,281 | A * | 12/2000 | Guidash | 257/292 |
| 6,352,869 | B1 * | 3/2002 | Guidash | 438/16 |
| 6,423,994 | B1 * | 7/2002 | Guidash | 257/292 |
| 6,466,266 | B1 * | 10/2002 | Guidash et al. | 348/308 |
| 6,486,913 | B1 * | 11/2002 | Afghahi et al. | 348/308 |
| 6,538,693 | B1 * | 3/2003 | Kozuka | 348/241 |
| 6,624,850 | B1 * | 9/2003 | Guidash | 348/308 |
| 6,657,665 | B1 * | 12/2003 | Guidash | 348/308 |
| 6,731,335 | B1 * | 5/2004 | Kim et al. | 348/308 |
| 6,960,799 | B2 * | 11/2005 | Descure | 257/292 |
| 6,977,684 | B1 * | 12/2005 | Hashimoto et al. | 348/294 |
| 7,250,970 | B2 * | 7/2007 | Shinohara | 348/308 |
| 7,446,357 | B2 * | 11/2008 | McKee | 257/292 |
| 2002/0180875 | A1 * | 12/2002 | Guidash | 348/280 |
| 2004/0159861 | A1 | 8/2004 | Mori et al. | |
| 2005/0224842 | A1 * | 10/2005 | Toyama | 257/225 |

(Continued)

FOREIGN PATENT DOCUMENTS

JP 9-46596 A 2/1997

(Continued)

*Primary Examiner*—Tuan V Ho
*Assistant Examiner*—Don Nguyen
(74) *Attorney, Agent, or Firm*—McDermott Will & Emery LLP

(57) ABSTRACT

There provided are a layout configuration in which fluctuation in pixel sensitivity characteristics is reduced and a solid-state image pickup device which attains high yield and high sensitivity. Respective sections included in pixels 2a and 2b, such as light receiving regions 20a and 20b of PDs 3a and 3b, transfer gate electrodes 4a and 4b, and FD 5, have outer shapes comprising lines extending in row directions and lines extending in column directions. The light receiving regions 20a and 20b, the transfer gate electrodes 4a and 4b, and FD 5 which the pixel pair includes are disposed in an axisymmetrical manner with respect to a straight line extending between the 2 pixels of the pixel pair. And FD 5 and source regions and drain regions of a reset transistor 6 and an amplifier transistor 12 are disposed in a straight line extending in a column direction.

7 Claims, 13 Drawing Sheets

| U.S. PATENT DOCUMENTS | | | | FOREIGN PATENT DOCUMENTS | | |
|---|---|---|---|---|---|---|
| 2006/0028565 A1* | 2/2006 | Kuwazawa | 348/294 | JP | 10-256521 | 9/1998 |
| 2006/0192263 A1* | 8/2006 | Inagaki et al. | 257/443 | JP | 2005-167958 | 6/2005 |
| 2008/0284882 A1 | 11/2008 | Mori et al. | | | | |
| 2009/0002538 A1 | 1/2009 | Mori et al. | | * cited by examiner | | | y (COLUMN)
x (ROW)

DIRECTION OF MISALIGNMENT

DIRECTION OF MISALIGNMENT

SOLID-STATE IMAGE PICKUP DEVICE

BACKGROUND OF THE INVENTION

1. Field of the Invention

The present invention relates to a solid-state image pickup device in which a plurality of pixels including photodiodes and transfer gate electrodes are disposed in a pixel region of a semiconductor substrate and more particularly, to a solid-state image pickup device in which 2 adjacent pixels share a part, including a floating diffusion, of circuits.

2. Description of the Background Art

In recent years, there has been an increasing demand for downsizing and high resolution of an image pickup device such as a CCD-type and a MOS-type image sensor (CMOS process compatible sensor). Since reducing an area per unit pixel is effective in meeting this demand, a variety of circuit designs have been conventionally devised.

FIGS. 10A and 10B are circuit diagrams illustrating examples of pixel parts of the CMOS process compatible sensor (hereinafter, referred to as a CMOS sensor) which has been conventionally proposed (for example, refer to the specification of U.S. Pat. No. 6,033,478). FIG. 10A shows an example of a 4-transistor-type CMOS sensor in which 4 transistors are required for 1 pixel and FIG. 10B shows an example of a 3-transistor-type CMOS sensor in which 3 transistor are required for 1 pixel. In specification of the present invention, in order to facilitate understanding, common reference numerals are used for common functional components in FIGS. 10A and 10B.

In FIG. 10A, a pixel pair 1 comprises 2 pixels 2a and 2b in adjacent rows. The pixels 2a and 2b comprise photodiodes 3a and 3b (hereinafter, referred to as PD 3a and PD 3b) and transfer gate electrodes 4a and 4b, respectively. On the other hand, the 2 pixels 2a and 2b share a floating diffusion 5 (hereinafter, referred to as FD 5), a reset transistor 6, an amplifier transistor 12, and a selection transistor 13. A transfer transistor comprises PDs 3a and 3b, a transfer gate electrode 4, and FD 5.

A pixel pair 1 shown in FIG. 10B has a configuration in which the selection transistor 13 is removed from a configuration of the pixel pair 1 shown in FIG. 10A, thereby attaining a reduction in an area. In the meantime, details of a general CMOS sensor in which FD 5 is not shared are disclosed, for example, in Japanese Laid-Open Patent Publication No. 9-46596.

Here, processes performed by circuits shown in FIGS. 10A and 10B will be briefly described. Signal charges accumulated in PDs 3a and 3b in an exposure period are transferred to FD 5 when a predetermined voltage is applied to the transfer gate electrodes 4a and 4b. Then, a potential of a gate of the amplifier transistor 12 is of a magnitude corresponding to a quantity of the signal charges transferred to FD 5, and a voltage signal generated by transforming a reference voltage VDD appears on a vertical signal line 15. In order to prevent blooming, the reset transistor 6 is controlled to be ON when exposure is performed on PDs 3a and 3b and the reference voltage VDD is applied to FD 5. Thus, since the charges in FD 5 are discharged externally, FD 5 is controlled to be in an initial state.

In the meantime, although a layout which realizes the above-mentioned circuits is not disclosed in specification or the like of the above-mentioned U.S. Pat. No. 6,033,478, a layout in general is as shown in FIG. 11. Specifically, the transfer gate electrodes 4a and 4b are disposed diagonally to light receiving regions 20a and 20b of the 2 PDs 3a and 3b adjacent in a column direction (y-axis direction). And FD 5, source and drain regions of the reset transistor 6, and source and drain regions of the amplifier transistor 12 are disposed in order in a row direction (x-axis direction). FIG. 12 is a diagram illustrating a view in which the pixel pair 1 in a layout shown in FIG. 11 is disposed in a pixel region in a matrix manner.

Inventors of the present invention found that when masks for forming the light receiving regions 20a and 20b of PDs 3a and 3b are disposed in a misaligned manner, a problem would arise. More specifically, although the masks should be disposed so that openings 22a and 22b of resist patterns are formed as shown in FIG. 13, when the openings 22a and 22b are disposed as shown in FIG. 14 due to misalignment, characteristics or the like of transfer transistors of respective pixels are changed. When the characteristics or the like of the transfer transistors are changed, sensitivity characteristics of the pixels 2a and 2b fluctuate and an image having a fine quality cannot be obtained, leading to a fatal flaw of the solid-state image pickup device.

SUMMARY OF THE INVENTION

Therefore, an object of the present invention is to provide a layout configuration in which fluctuation in pixel sensitivity characteristics is reduced and a solid-state image pickup device which attains high yield and high sensitivity.

The solid-state image pickup device according to the present invention comprises a plurality of pixels, each of which includes a photodiode and a transfer gate electrode for transferring a charge accumulated in the photodiode. A pixel pair includes 2 pixels adjacent in a column direction and the pixel pair share the floating diffusion and a MOS-type amplifier transistor of which gate electrode is connected to the floating diffusion. The pixels are disposed in a row direction in a pixel region of a surface of a semiconductor substrate. Light receiving regions of 2 photodiodes, 2 transfer gate electrodes, and 1 floating diffusion which are included in each pixel pair have outer shapes comprising lines extending in row directions and lines extending in column directions and disposed in order in a row direction. The light receiving regions of the 2 photodiodes, the 2 transfer gate electrodes, and the 1 floating diffusion which are included in the each pixel pair are disposed in an axisymmetrical manner with respect to a straight line extending between the 2 pixels included in the pixel pair.

For example, the light receiving region, the transfer gate electrode, and the floating diffusion have rectangular shapes whose long sides are straight lines extending in column directions.

A wiring connecting to the transfer gate electrode in each pixel may comprise a first wiring which extends in a row direction between the light receiving regions of the 2 pixels of the pair and is connected to one end of the transfer gate electrode and a second wiring, connected to the first wiring, which is connected to other end of the transfer gate electrode, extends along a part of an exterior edge of the floating diffusion, and is provided in adjacent pixels in a row direction.

The solid-state image pickup device may further comprise MOS-type reset transistors, each of which is provided for each pixel pair and connects the floating diffusion at a reference potential, wherein source regions and drain regions of the amplifier transistor and the reset transistor and the floating diffusion may be disposed in a straight line extending in a column direction.

A gate electrode of the reset transistor included in a pixel pair and a wiring connected thereto may be disposed on a straight line extending in a row direction between the pixel pair and a pixel pair adjacent in a column pair.

By using a layout according to the present invention, even if the light receiving region of the photodiode is formed so as to be misaligned, sensitivity characteristics of each pixel do not change, thereby resulting in the solid-state image pickup device which can offer a high-quality image.

These and other objects, features, aspects and advantages of the present invention will become more apparent from the following detailed description of the present invention when taken in conjunction with the accompanying drawings.

BRIEF DESCRIPTION OF THE DRAWINGS

FIG. 4A is a diagram explaining a manufacturing process of a gate electrode or the like;

FIG. 4D is a diagram illustrating a mask pattern used in a manufacturing process of the gate electrode or the like;

FIG. 5D is a diagram illustrating a mask pattern used in a manufacturing process of the gate electrode or the like;

DESCRIPTION OF THE PREFERRED EMBODIMENTS

First Embodiment

Figure 1A:
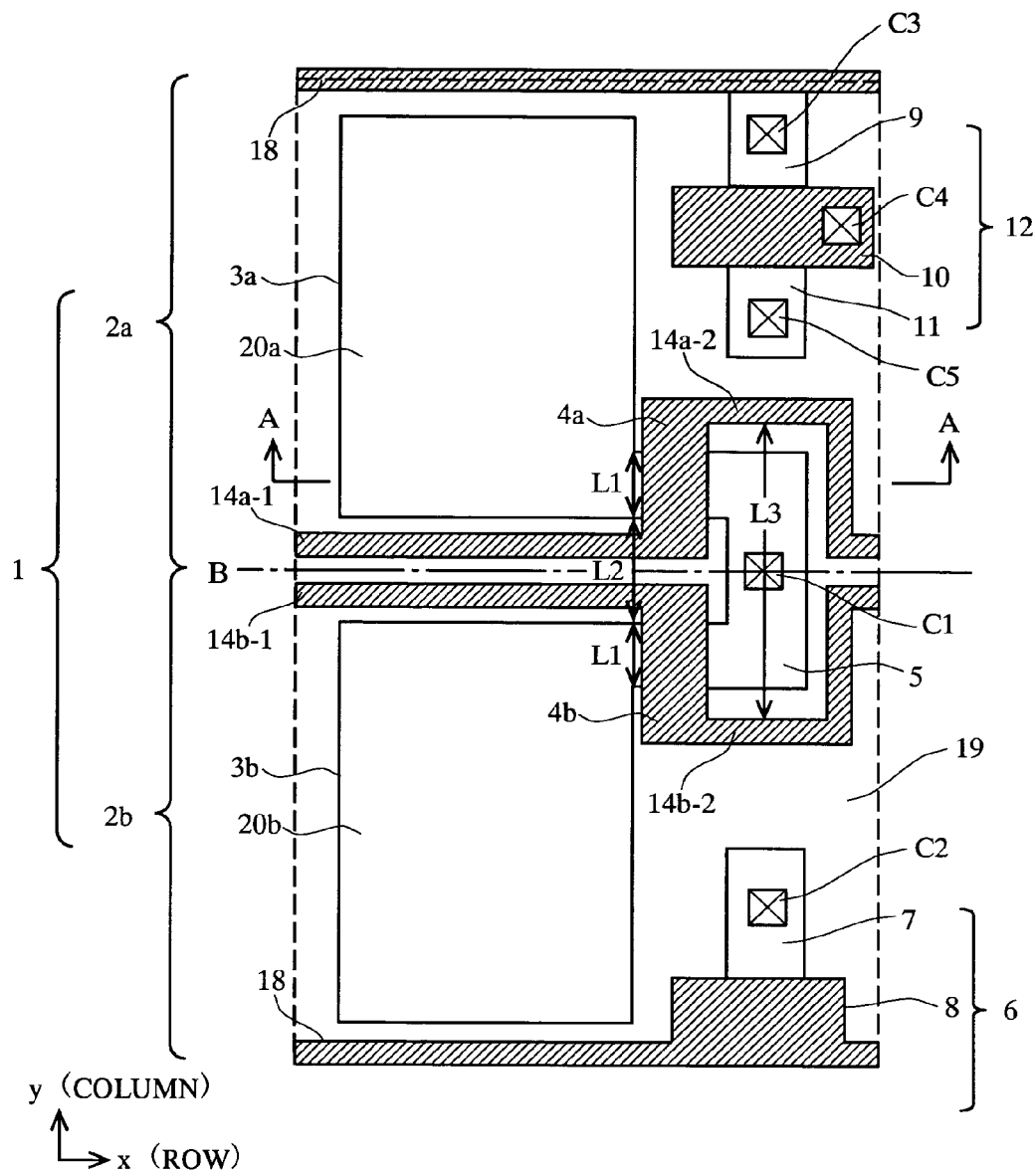
FIG. 1A is a plane diagram illustrating a solid-state image pickup device according to the present invention.
Figure 1B:
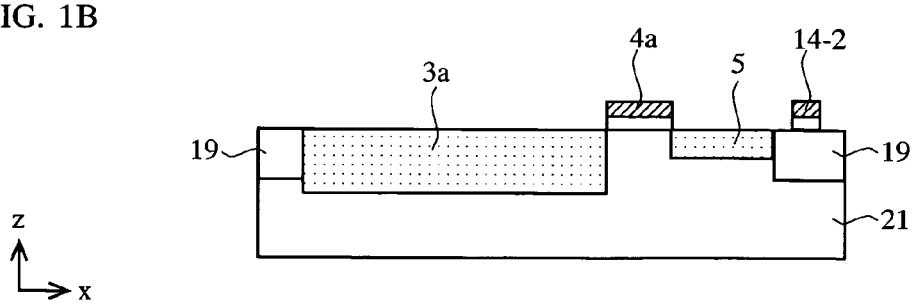
FIG. 1B is a diagram illustrating a cross-sectional view of the solid-state image pickup device according to the present invention.
Figure 2:
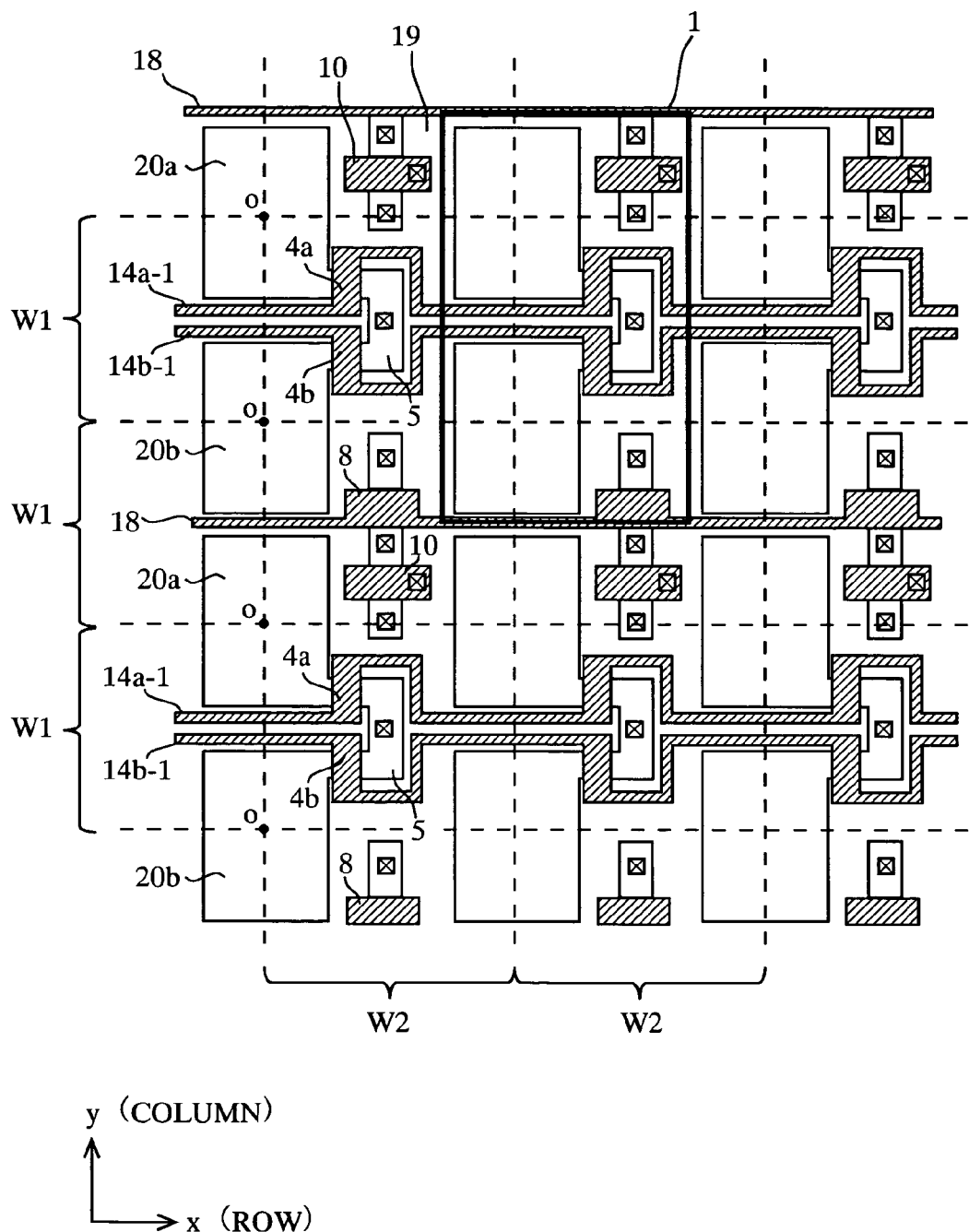
FIG. 2 is a diagram illustrating a plane view of a pixel region.
Figure 10A:
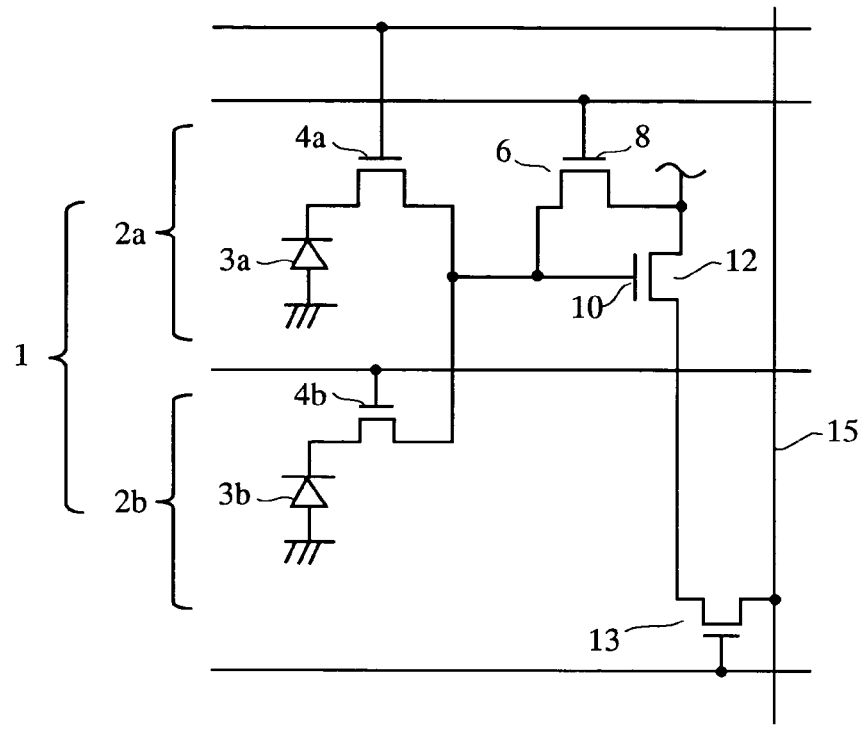
FIG. 10A is a circuit diagram illustrating an example of a pixel pair.
Figure 10B:
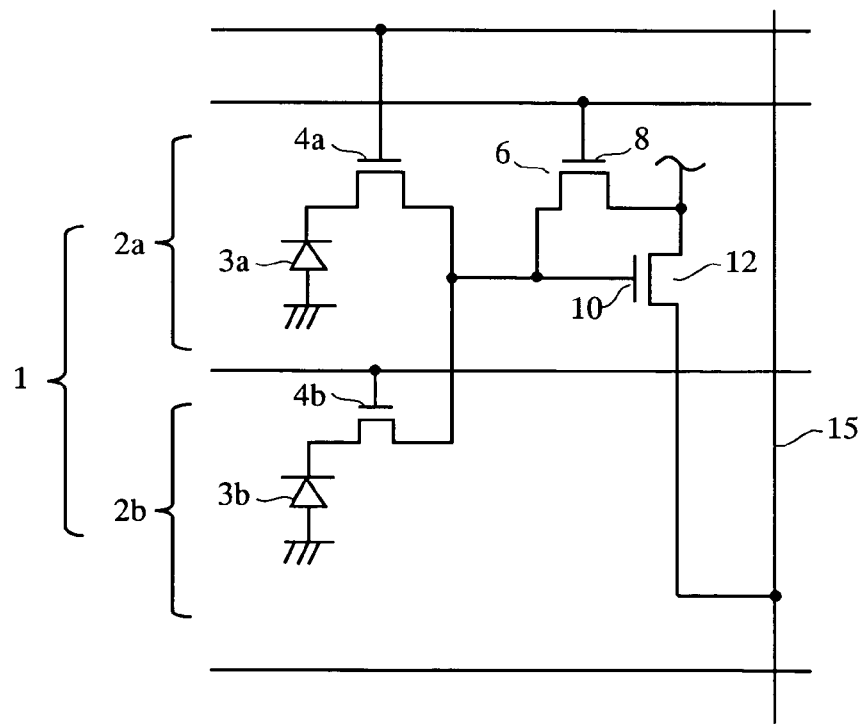
FIG. 10B is a circuit diagram illustrating another example of a pixel pair.
Figure 11:
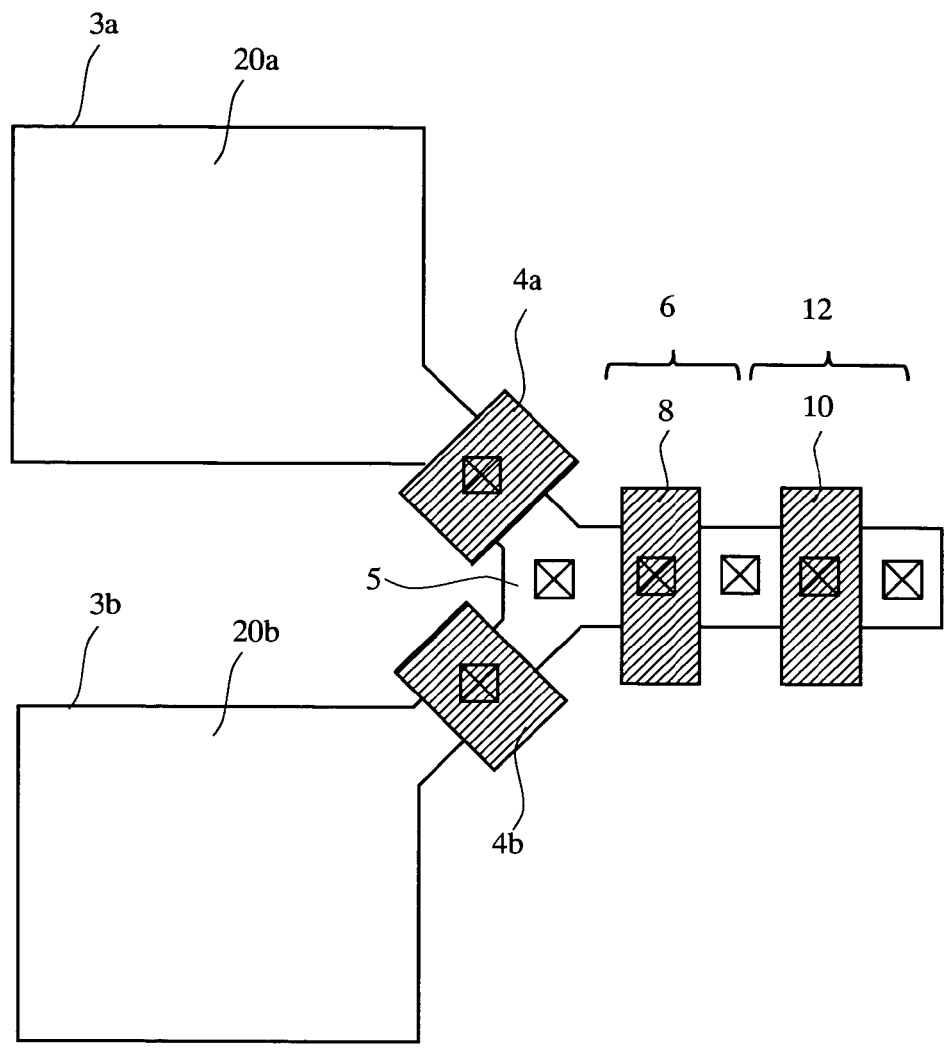
FIG. 11 is a plane diagram of a conventional pixel pair.
Figure 12:
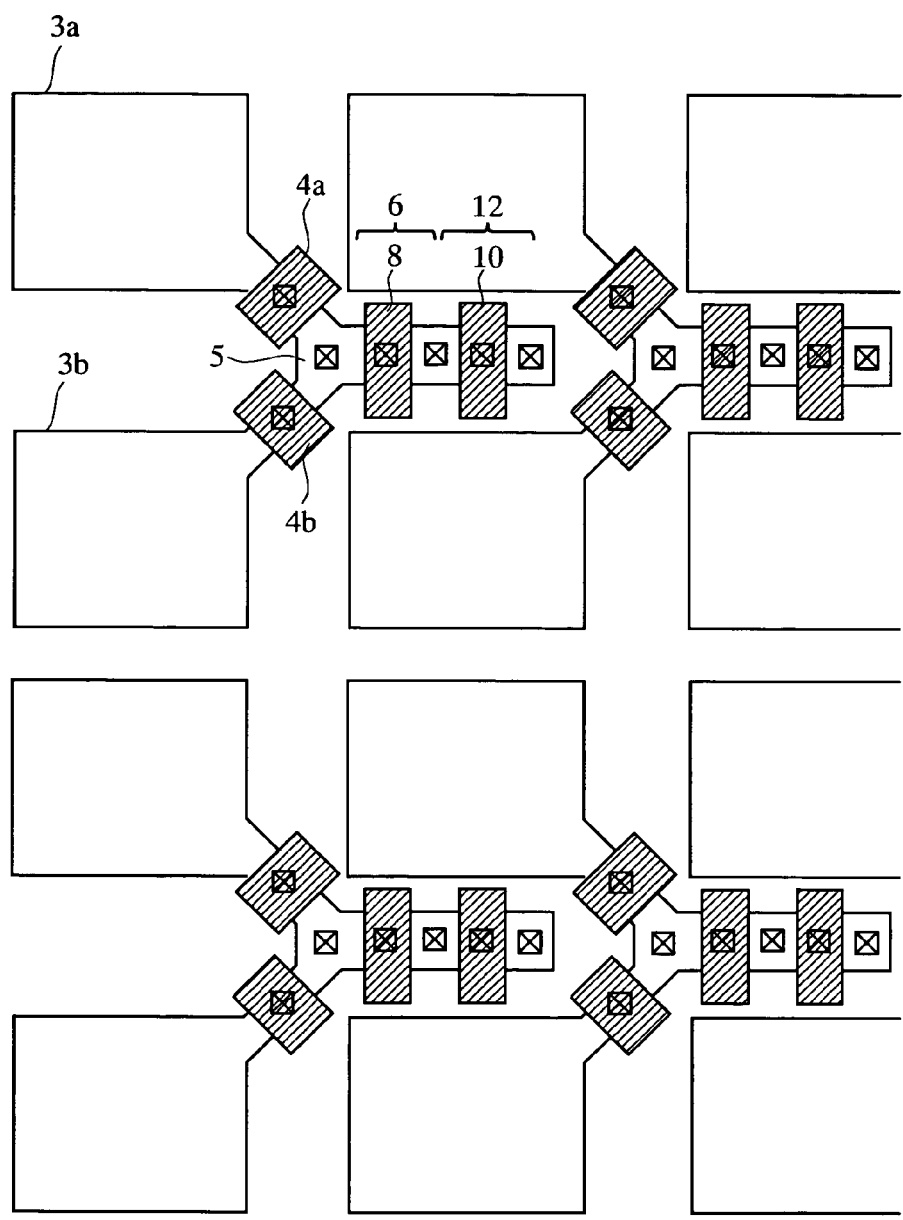
FIG. 12 is a plane diagram of a pixel region.
Figure 13:
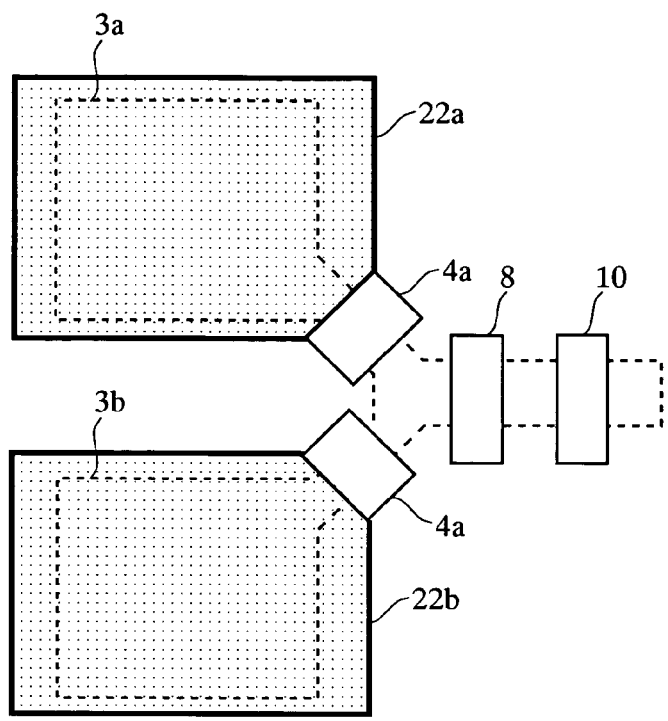
FIG. 13 is a diagram illustrating positions of openings of a resist pattern, which are positioned in an ideal manner.
Figure 14:
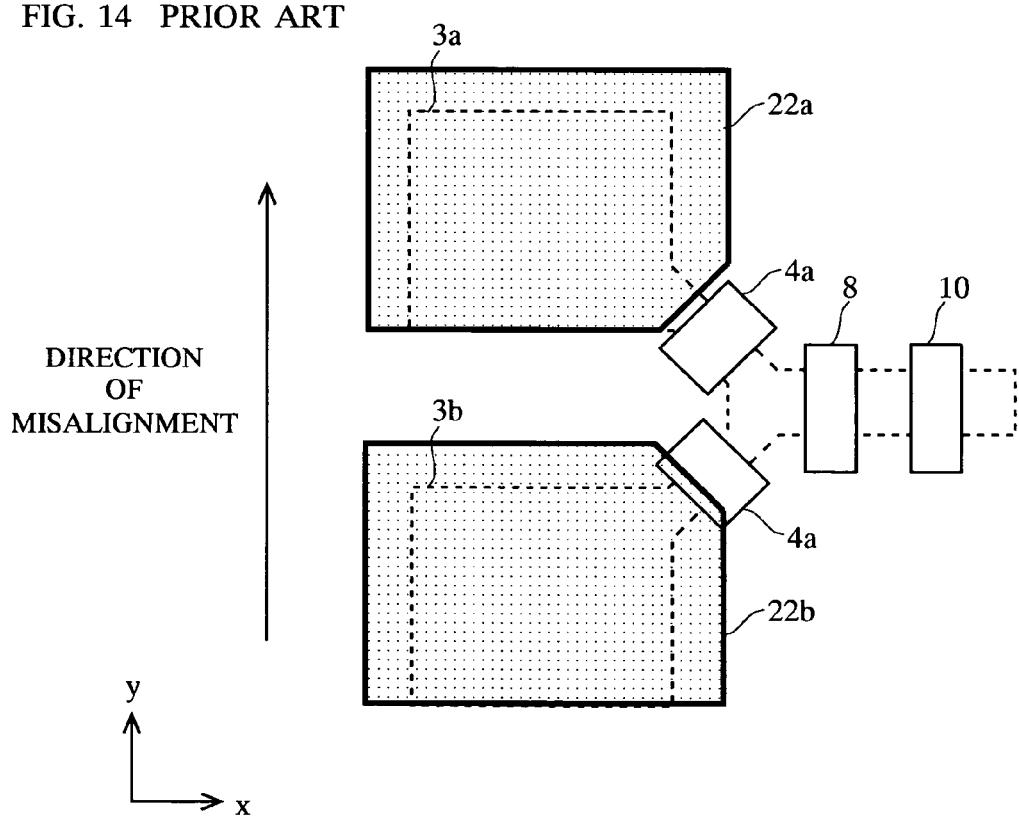
FIG. 14 is a diagram illustrating positions of openings of the resist pattern, obtained when misalignment of the mask arises in a column direction.

FIG. 1A is a plane diagram illustrating a layout of a pixel cell of a solid-state image pickup device (CMOS sensor) according to an embodiment of the present invention and shows the layout which realizes circuits shown in FIG. 10B. FIG. 1B is a diagram illustrating a cross sectional view along a line A-A in FIG. 1A. And FIG. 2 is a diagram illustrating a view in which a pixel pair 1 is disposed in a pixel region in a matrix manner (x and y directions).

The pixel pair 1 comprises 2 pixels 2a and 2b adjacent in a column direction (y direction). A pixel 2a has a photodiode 3a and a transfer gate electrode 4a, and a pixel 2b has a photodiode 3b and a transfer gate electrode 4b. The pixels 2a and 2b share a floating diffusion 5 (hereinafter, referred to as FD 5), a reset transistor 6, and an amplifier transistor 12. Respective sections, which the pixels 2a and 2b comprise, such as light receiving regions 20a and 20b of PDs 3a and 3b, transfer gate electrodes 4a and 4b, and FD 5, have an outer shape comprising lines extending in a row direction and lines extending in a column direction.

The light receiving regions 20a and 20b, the transfer gate electrodes 4, and FD 5 in FIG. 1A are disposed in order in a row direction, having a rectangular shape whose long side is a line extending in a column direction or having a shape which combines rectangles whose sizes are different. The light receiving regions 20a and 20b, the transfer gate electrodes 4a and 4b, and FD 5 are disposed in an axisymmetrical manner with respect to a straight line extending between the 2 pixels of the pair. And FD 5 and source and drain regions 7, 9, and 11 of the reset transistor 6 and the amplifier transistor 12 are disposed in a straight line extending in a column direction. As shown in FIG. 2, a distance between centers o of the light receiving regions 20a and 20b in a column direction is W1 and a distance between centers o of the light receiving regions 20a and 20b in a row direction is W2.

The transfer gate electrode 4a is connected to 2 wirings, i.e., wirings 14a-1 and 14a-2. The wiring 14a-1 is connected to one of two ends of the transfer gate electrode 4a and extends in a row direction between the light receiving regions 20a and 20b included in the pixel pair. The wiring 14a-2 is connected to the other of the two ends of the transfer gate electrode 4a, extends along an exterior edge of FD 5, and is connected to a wiring (equivalent to a wiring 14a-1) of a pixel adjacent to the pixel 2a. Similarly, the transfer gate electrode 4b is connected to a wiring 14b-1 extending in a row direction between the light receiving regions 20a and 20b and a wiring 14b-2 extending along a part of an exterior edge of FD 5.

A distance L3 between wirings 14a-2 and 14b-2 in FIG. 1A is longer than a length which is a sum of a double of a width L1 of an active region under the transfer gate electrodes 4a and 4b and a width L2 of an isolation therebetween. More specifically, when a layout is designed using 0.25 µm CMOS rule, since a minimum value of a width L1 of the active region is 0.4 µm and a width L2 of the isolation 19 is 0.4 µm, the distance L3 is longer than 1.2 µm.

When a solid-state image pickup device having a layout shown in FIGS. 1A and 1B is manufactured using a general photolithographic technique, there is an advantage of suppressing a reduction in yield even in a case where misalignment of masks arises. Here, an example of a method for manufacturing a CMOS sensor will be briefly described. Materials are not limited to those used for describing the method and needless to say, other insulating materials and conductive materials may be used.

Figure 3A:
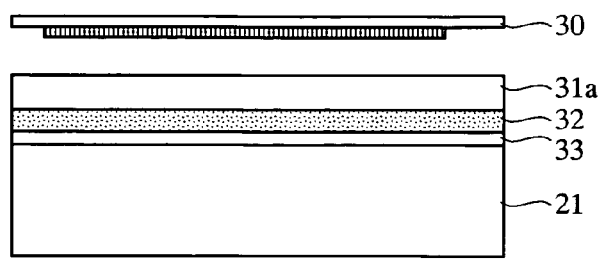
FIG. 3A is a diagram explaining a manufacturing process of an isolation.
Figure 3B:
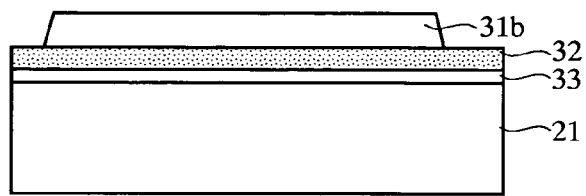
FIG. 3B is a diagram explaining a manufacturing process following the process shown in FIG. 3A.
Figure 3C:
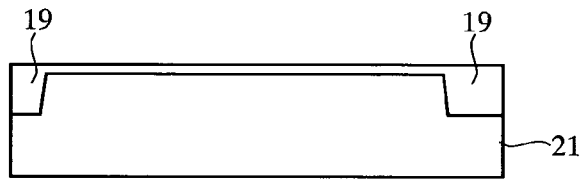
FIG. 3C is a diagram explaining a manufacturing process following the process shown in FIG. 3B.
Figure 3D:
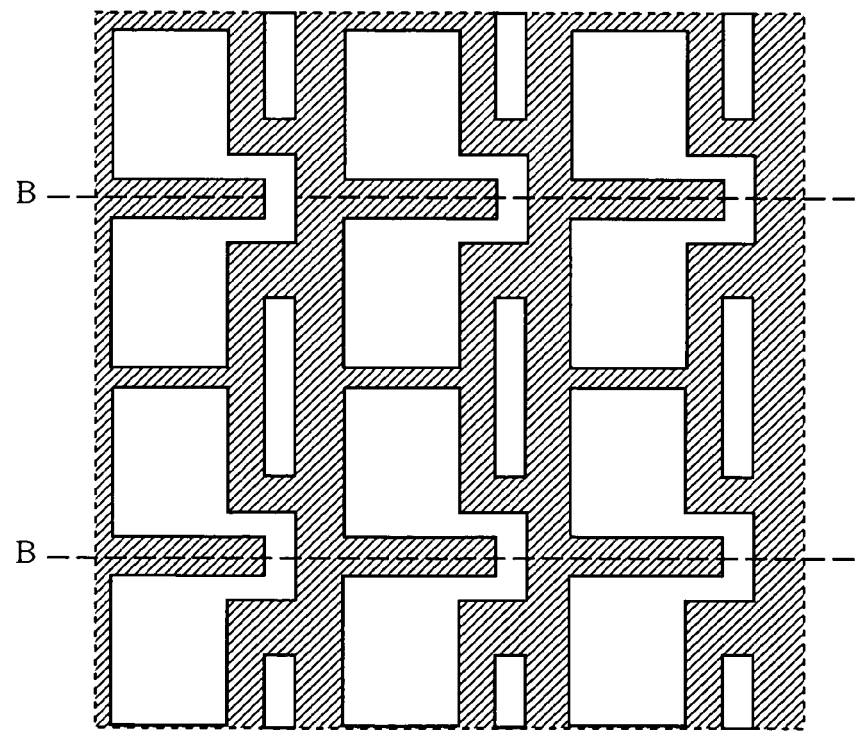
FIG. 3D is a diagram illustrating a mask pattern used in the manufacturing processes of the isolation.
Figure 4A:
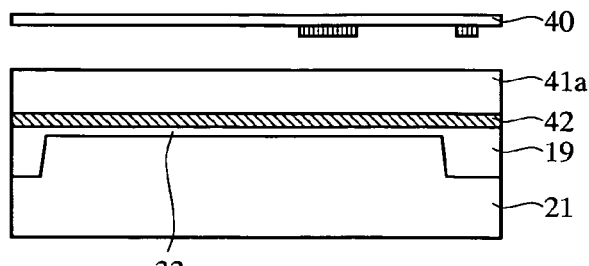
Figure 4B:
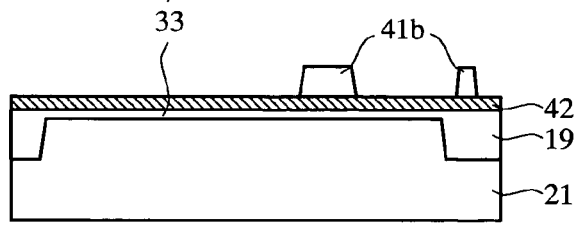
FIG. 4B is a diagram explaining a manufacturing process following the process shown in FIG. 4A.
Figure 4C:
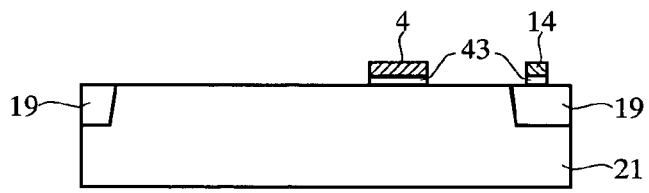
FIG. 4C is a diagram explaining a manufacturing process following the process shown in FIG. 4B.
Figure 4D:
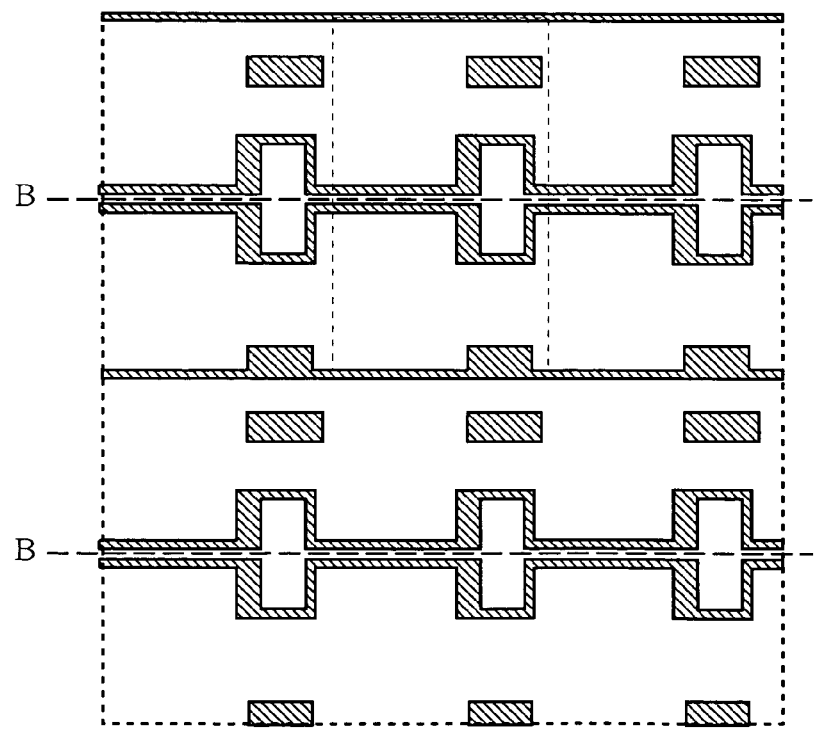

First, an isolation 19, which is STI (Shallow Trench Isolation) or LOCOS (Local Oxidation of Silicon), is formed on a silicon substrate 21 (semiconductor substrate). With reference to FIGS. 3A, 3B, and 3C, a method for forming the isolation 19 will be briefly described. A silicon oxide film 33 is formed on a surface of the silicon substrate 21, and further a silicon nitride film 32 and a photo resist 31a are formed (FIG. 3A). Next, exposure and etching for the photo resist 31a are performed by using a mask 30 and a resist pattern 31b is formed (FIG. 3B). Using the resist pattern 31b, an isolation 19 is formed by depositing a silicon oxide film in a groove which is made by etching on a surface of the silicon substrate 21 or by thermally-oxidizing the silicon oxide film 33 (FIG. 3C). In FIG. 3D, a pattern of the mask 30 used in this case is shown. In this pattern, a hatching portion(s) shows a part(s) on which the isolation 19 is formed and a blank portion(s) shows an active region(s) (a channel region immediately under the light receiving regions 20a and 20b, FD 5, and the transfer gate electrodes 4a and 4b and a channel region immediately under source drain regions 7, 9, and 11 of respective MOS-type transistors (the amplifier transistor 12 and the reset transistor 6) and gate electrodes 8 and 10). As shown in FIG. 3D, patterns of the light receiving regions 20a and 20b and FD 5 in the pair 1 are axisymmetrical with respect to a line B extending in a row direction. Next, with reference to FIGS. 4A, 4B, and 4C, a method for forming the transfer gate electrodes 4a and 4b; wirings connected thereto 14a-1, 14a-2, 14b-1, and 14b-2; the reset gate electrode 8; a wiring 18 connected thereto; and an amplification gate electrode 10 will be described. First, a polysilicon film 42 which is a conductive thin film is formed on the silicon substrate 21 having the silicon oxide film 33 formed on a surface thereof and thereon a photo resist 41a is formed (FIG. 4A). Next, exposure and etching for the photo resist 41a are performed by using a mask 40 and a resist pattern 41b is formed (FIG. 4B). And etching for the polysilicon film 42 and the silicon oxide film 33 which have been exposed around the resist pattern 41b is performed and respective gate electrodes 4, 8, and 10, wirings 14 and 18, and an insulating film 43 are formed (FIG. 4C). In FIG. 4D, a pattern of the mask 40 used in this case is shown. In this pattern, a hatching portion(s) shows a part(s) on which the respective gate electrodes 4, 8, and 10 and wirings 14 and 18 are formed. As shown in FIG. 4D, patterns of the transfer gate electrodes 4a and 4b and wirings connected thereto 14a-1, 14a-2, 14b-1, and 14b-2 in the pair 1 are axisymmetrical with respect to a line B extending in a row direction.

Figure 5A:
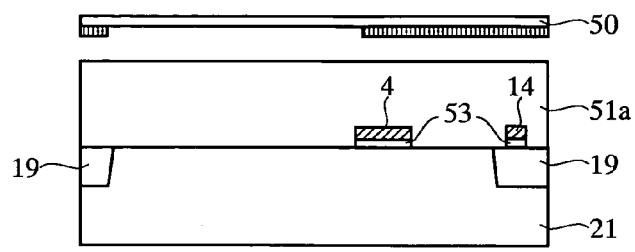
FIG. 5A is a diagram explaining a manufacturing process of light receiving regions of a photodiode.
Figure 5B:
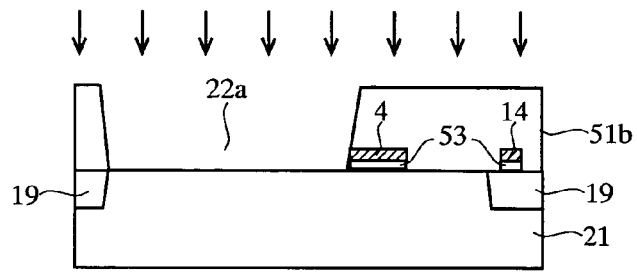
FIG. 5B is a diagram explaining a manufacturing process following the process shown in FIG. 5A.
Figure 5C:
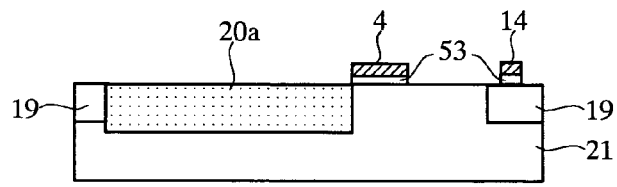
FIG. 5C is a diagram explaining a manufacturing process following the process shown in FIG. 5B.
Figure 5D:
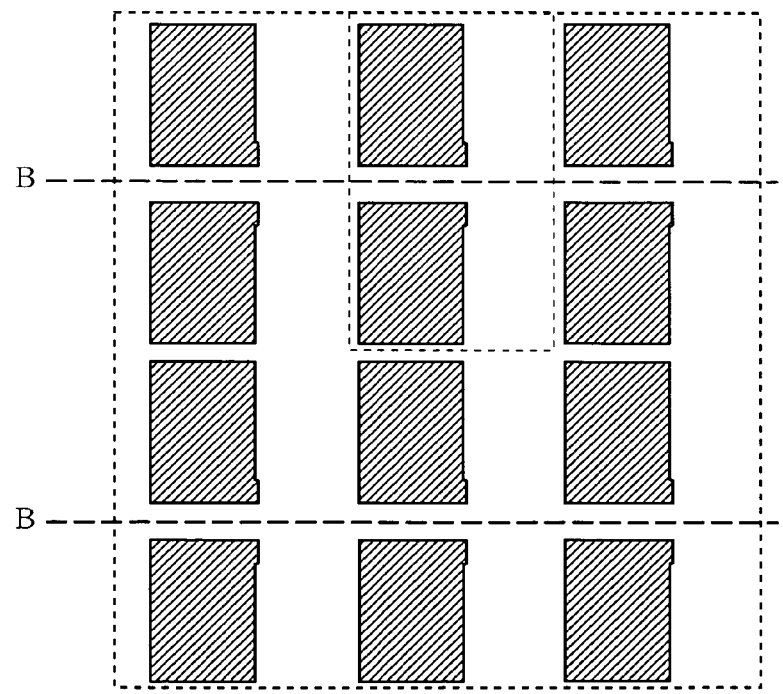

Next, with reference to FIGS. 5A, 5B, and 5C, a method for forming the light receiving regions 20a and 20b of PDs 3a and 3b will be described. First, a photo resist 51a is formed on the silicon substrate 21 (FIG. 5A). Next, exposure and etching for the photo resist 51a are performed by using a mask 50 and a resist pattern 51b is formed (FIG. 5B). And ion of impurity such as arsenic is implanted in openings 22a and 22b of the resist pattern 51b on the silicon substrate 21, thereby forming the light receiving regions 20a and 20b (FIG. 5C). In FIG. 5D, a pattern of the mask 50 used in this case is shown. In FIG. 5D, a hatching portion(s) shows a part(s) on which the light receiving regions 20a and 20b of PDs 3a and 3b are formed. As shown in FIG. 5D, the patterns of the light receiving regions 20a and 20b in the pair 1 are axisymmetrical with respect to a line B extending in a row direction.

Figure 6:
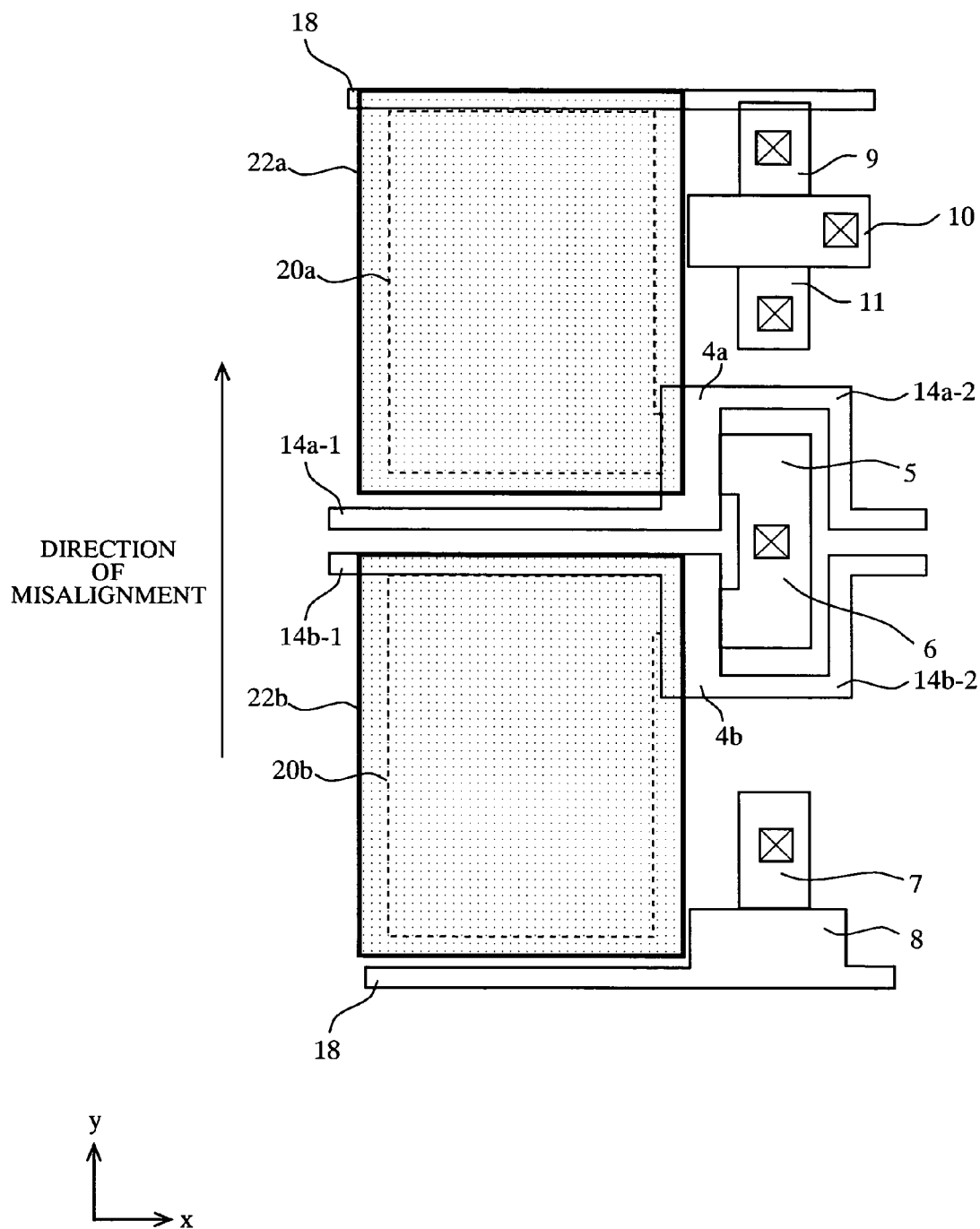
FIG. 6 is a diagram illustrating positions of openings obtained when the mask is misaligned in a column direction.
Figure 7:
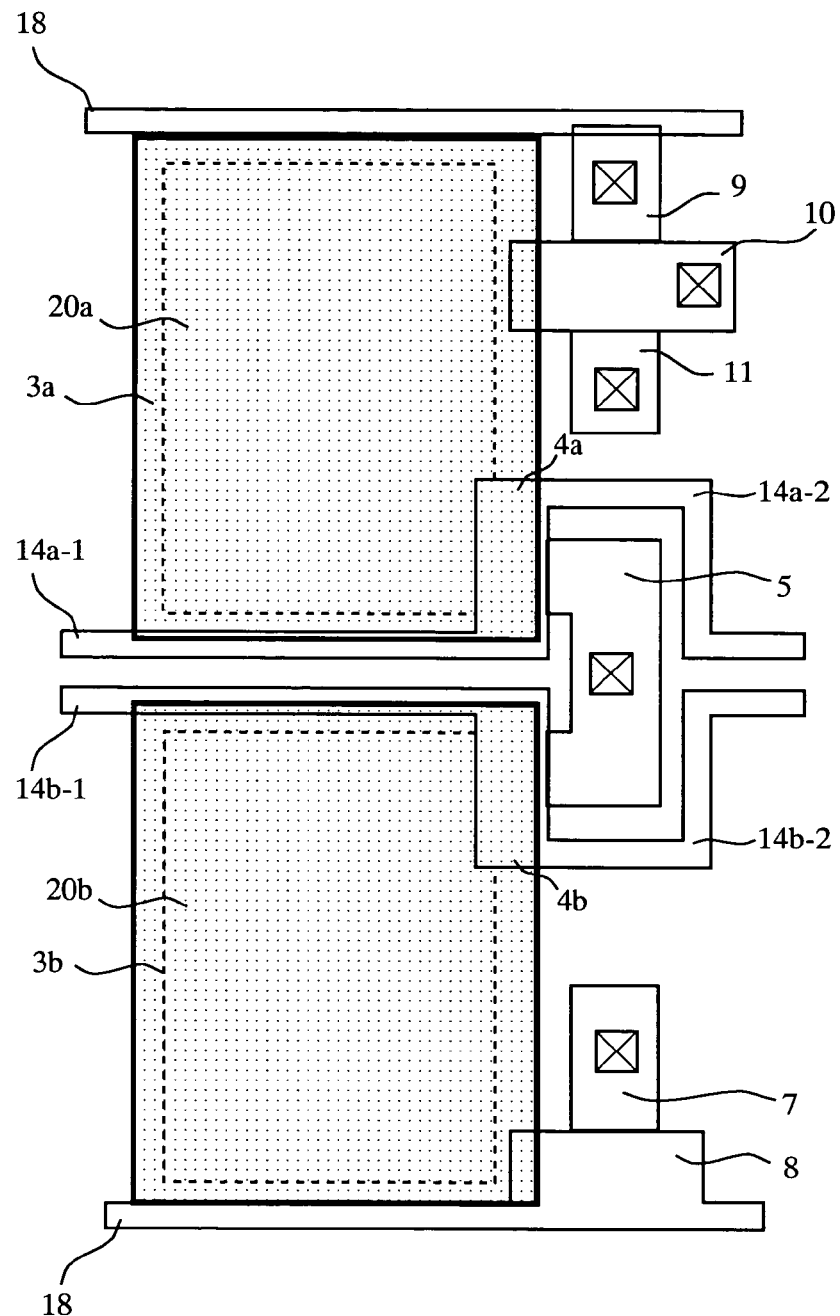
FIG. 7 is a diagram illustrating positions of openings obtained when the mask is misaligned in a row direction.

As described above, the mask 30 for forming the isolation 19, the mask 40 for forming respective electrodes or the like, and the patterns for forming the light receiving regions 20a and 20b of PDs 3a and 3b have an outer shape comprising lines extending in a row direction and lines extending in a column direction. Accordingly, even if disposition of the mask 50 is misaligned and the openings 22a and 22b of the resist patterns 41a and 41b are deviated from proper positions thereof, in a row or a column direction, areas of the transfer gate electrodes 4a and 4b exposed around the openings 22a and 22b do not change. Therefore, characteristics of the transfer transistors of the pixels 2a and 2b in the pair 1 do not change and thereby sensitivity characteristics of the pixels 2a and 2b do not change. Thus, by adopting the layout described above, a solid-state image pickup device which can achieve high sensitivity and attain a high-quality image can be manufactured with good yield. Dotted lines in FIGS. 6 and 7 show the light receiving regions 20a and 20b obtained when disposition of the mask 30 is misaligned.

Figure 8B:
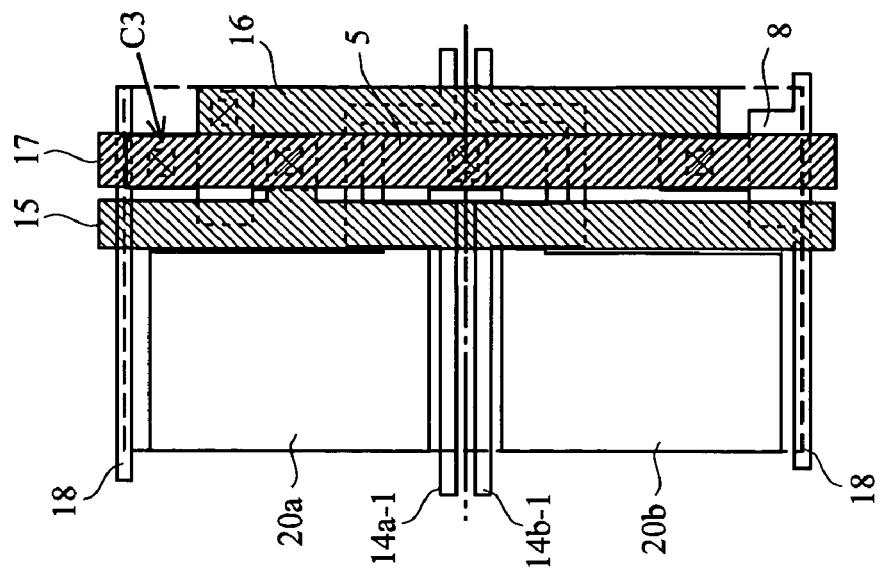
FIG. 8B is a diagram explaining a procedure of wiring formation, following the procedure shown in FIG. 8A.
Figure 8A:
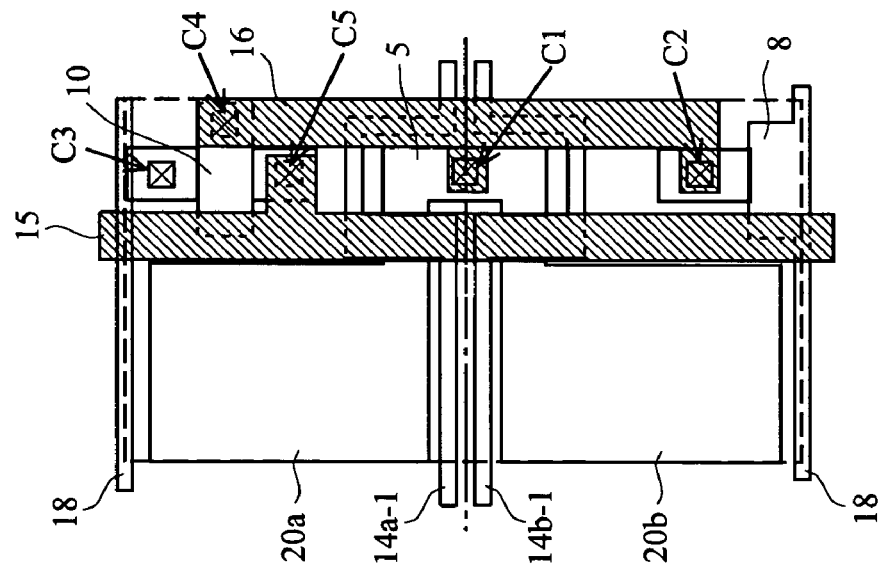
FIG. 8A is a diagram explaining a procedure of wiring formation in a CMOS sensor shown in FIG. 1A.

In the meantime, as described above, when a wiring connected to the transfer gate electrode 4 is formed by using a same process as that for the transfer gate electrode 4, a number of manufacturing processes can be reduced as compared with a case where a wiring such as an aluminum wiring is formed in a separate process. FIGS. 8A and 8B show procedures of forming wirings in the CMOS sensor shown in FIG. 1A. To explain it simply, a vertical signal line 15, which extends in a column direction and is connected to a contact C5 of a drain region 11 of the amplifier transistor 12, is formed. In addition, a wiring which connects contacts C1, C2, and C4 and extends in a column direction, i.e., a wiring 16 which connects FD 5 with a gate electrode 10 of the amplifier transistor 12 and a source region 7 of the reset transistor is formed (FIG. 8A). The vertical signal line 15 is a wiring for reading out an image signal from each pixel to an outside. Finally, a wiring 17 which is connected to a contact C3 provided in a source region 9 (or a drain region of the reset transistor 6) of the amplifier transistor 12 and extends in a column direction is formed (FIG. 8B).

Figure 9A:
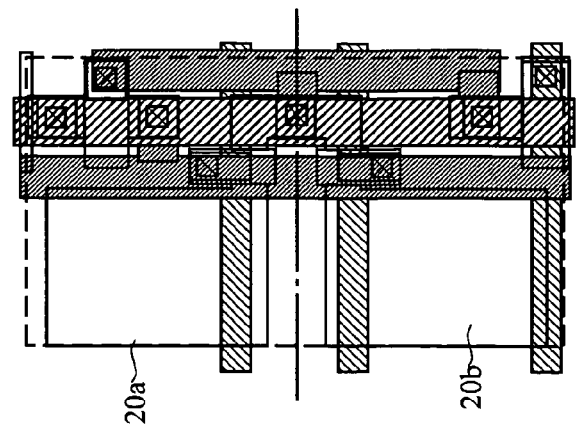
FIG. 9A is a diagram explaining a procedure of wiring formation in a case where a transfer gate wiring is formed in a process different from a process in which a transfer gate electrode is formed.
Figure 9B:
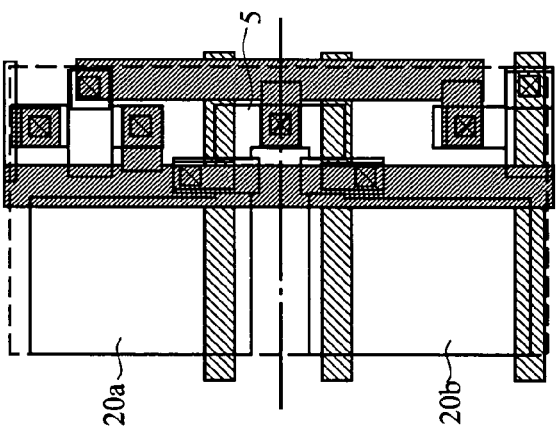
FIG. 9B is a diagram illustrating a procedure of wiring formation, following the procedure shown in FIG. 9A.
Figure 9C:
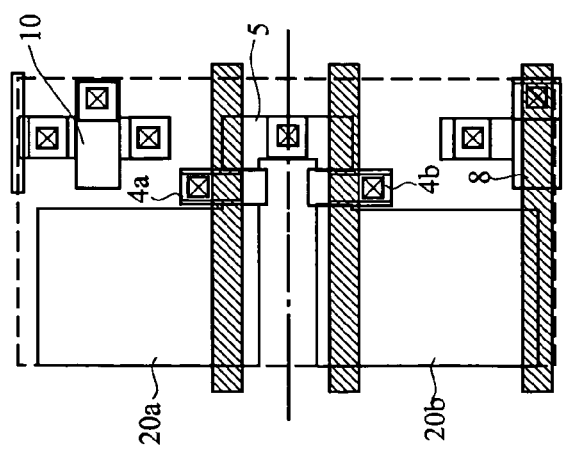
FIG. 9C is a diagram illustrating a procedure of wiring formation, following the procedure shown in FIG. 9B.

FIGS. 9A, 9B, and 9C show procedures of wiring formation in a case where the wirings of the transfer gate electrodes 4a and 4b are aluminum wirings which are not integrated with the transfer gate electrodes 4a and 4b. When the wirings of the transfer gate electrodes 4a and 4b are aluminum wirings, a number of wiring layers increases as compared with a number of layers in the CMOS sensor according to the present invention. As in the CMOS sensor according to the present invention, when the number of the wiring layers is reduced by forming the wirings 14a-1, 14a-2, 14b-1, and 14b-2 so as to be integrated with the transfer gate electrodes 4a and 4b, better sensitivity characteristics can be attained. That is because reducing a total number of the wirings decreases regions where incident light is shut out by wirings, thereby allowing the light receiving regions 20a and 20b to be larger.

Needless to say, the layout method according to the present invention is applicable to various solid-state image pickup devices or the like which are manufactured by using photolithography and to a CMOS sensor in which a plurality of pixels equal to or more than 3 share a part of circuits.

The solid-state image pickup device can be used in various apparatuses, such as a mobile phone terminal, a digital camera, a copying machine, a facsimile machine or the like, in which an image pickup function is provided. And the light receiving element according to the present invention is applicable to a solar cell.

While the invention has been described in detail, the foregoing description is in all aspects illustrative and not restrictive. It is understood that numerous other modifications and variations can be devised without departing from the scope of the invention.

What is claimed is:

1. A solid-state image pickup device, comprising:
    a plurality of pixels, each of which includes a photodiode and a transfer gate electrode for transferring a charge accumulated in the photodiode and which are disposed in a pixel region of a surface of a semiconductor substrate;
    a plurality of floating diffusions, each of which is provided for a pixel pair including two pixels adjacent in a column direction;
    a plurality of MOS-type amplifier transistors, respectively having gate electrodes respectively connected to the floating diffusions; and
    a plurality of first wirings, each of which connects the transfer gate electrodes of two pixels adjacent in a row direction, wherein:
    light receiving regions of the photodiodes, the transfer gate electrodes, the floating diffusions have outer shapes consisting of lines extending in row directions and lines extending in column directions and are disposed in an axisymmetrical manner with respect to a straight line extending between a pair of the photodiodes included in the pixel pair, and
    the first wiring connecting the transfer gate electrodes of the two pixels adjacent in the row direction is unified with the transfer gate electrodes.

2. The solid-state image pickup device according to claim 1, wherein:
    the light receiving region, the transfer gate electrode, and the floating diffusion have rectangular shapes whose long sides are straight lines extending in column directions; and
    the long side of the floating diffusion is approximately twice or more as long as a shorter side thereof.

3. The solid-state image pickup device according to claim 1, wherein the first wiring includes:
    a first part which extends in a row direction between the light receiving regions of the pixel pair and is connected to one end of the transfer gate electrode of the pixel; and
    a second part which extends along a part of an exterior edge of the floating diffusion and is connected to another end of the transfer gate electrode of the pixel and to a first part provided in the pixel adjacent in the row direction.

4. The solid-state image pickup device according to claim 1, further comprising a plurality of MOS-type reset transistors, each of which is provided in the each pixel pair and connects the floating diffusion at a reference potential, wherein
    a source region and a drain region of the amplifier transistor, a source region and a drain region of the reset transistor, and the floating diffusion are disposed in a straight line extending in a column direction.

5. The solid-state image pickup device according to claim 4, further comprising a plurality of second wirings, each of which connects gate electrodes of the reset transistors of two pixels adjacent in a row direction, wherein
    the second wiring connecting the gate electrodes and the gate electrode of the reset transistor provided in the pixel pair are disposed on a straight line extending in a row direction between the pixel pair and a pixel pair adjacent in a column direction.

6. The solid-state image pickup device according to claim 5, wherein the second wiring connecting the gate electrodes of the reset transistors is unified with the gate electrodes.

7. The solid-state image pickup device according to claim 1, wherein directions from the photo diodes of the pixel pair to the floating diffusion are substantially the same with each other.

* * * * *

UNITED STATES PATENT AND TRADEMARK OFFICE
CERTIFICATE OF CORRECTION

| | |
|---|---|
| PATENT NO. | : 7,595,829 B2 |
| APPLICATION NO. | : 11/494727 |
| DATED | : September 29, 2009 |
| INVENTOR(S) | : Sougo Ohta |

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 506 days.

Signed and Sealed this

Fourteenth Day of December, 2010

David J. Kappos
*Director of the United States Patent and Trademark Office*